United States Patent
Lee et al.

(10) Patent No.: US 11,888,069 B2
(45) Date of Patent: Jan. 30, 2024

(54) THIN FILM TRANSISTOR AND DISPLAY APPARATUS COMPRISING THE SAME

(71) Applicant: LG Display Co., Ltd., Seoul (KR)

(72) Inventors: Dohyung Lee, Paju-si (KR); Juheyuck Baeck, Paju-si (KR); ChanYong Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 228 days.

(21) Appl. No.: 17/398,767

(22) Filed: Aug. 10, 2021

(65) Prior Publication Data
US 2022/0190170 A1    Jun. 16, 2022

(30) Foreign Application Priority Data
Dec. 14, 2020  (KR) .................. 10-2020-0174708

(51) Int. Cl.
*H01L 29/786* (2006.01)
*H01L 27/12* (2006.01)
*G09G 3/3233* (2016.01)

(52) U.S. Cl.
CPC ..... *H01L 29/78645* (2013.01); *G09G 3/3233* (2013.01); *H01L 27/1225* (2013.01); *H01L 29/7869* (2013.01); *G09G 2300/0842* (2013.01)

(58) Field of Classification Search
CPC ............ H01L 27/1225; H01L 27/3244; H01L 27/3272; H01L 29/78645; H01L 29/7869; H01L 29/4173; H01L 29/786; H01L 29/78648; H01L 29/78633; G09G 3/3233; G09G 3/20; G09G 3/344; G09G 2300/0842; G09G 2300/0408; G09G 2300/08
See application file for complete search history.

(56) References Cited

U.S. PATENT DOCUMENTS

| | | | |
|---|---|---|---|
| 5,124,769 A | 6/1992 | Tanaka et al. | |
| 6,534,788 B1 | 3/2003 | Yeo et al. | |
| 8,420,441 B2 * | 4/2013 | Yamazaki | H04B 1/16 438/104 |
| 9,437,624 B2 * | 9/2016 | Cha | H01L 29/66757 |

(Continued)

FOREIGN PATENT DOCUMENTS

| EP | 0981165 A1 | 2/2000 |
|---|---|---|
| KR | 10-2017-0015292 A | 2/2017 |

OTHER PUBLICATIONS

Extended European Search Report, European Patent Office Application No. 21207964.4, dated May 18, 2022, 8 pages.

(Continued)

*Primary Examiner* — Nikolay K Yushin
(74) *Attorney, Agent, or Firm* — Fenwick & West LLP

(57) ABSTRACT

One embodiment of the present disclosure provides a thin film transistor comprising an auxiliary electrode, a gate electrode and an active layer disposed between the auxiliary electrode and the gate electrode, wherein the active layer includes a channel portion overlapped with the gate electrode, a first connection portion disposed at one side of the channel portion, and a second connection portion disposed at the other side of the channel portion, and the channel portion includes a first portion overlapped with the auxiliary electrode and a second portion not overlapped with the auxiliary electrode. One embodiment of the present disclosure also provides a display apparatus comprising the thin film transistor.

20 Claims, 12 Drawing Sheets

(56) References Cited

U.S. PATENT DOCUMENTS

| | | | |
|---|---|---|---|
| 9,553,202 B2 | 1/2017 | Kurata et al. | |
| 9,806,197 B1 | 10/2017 | Yoshiga | |
| 10,658,389 B2 | 5/2020 | Kurata et al. | |
| 11,087,696 B2* | 8/2021 | Kim | H10K 71/00 |
| 2011/0037068 A1* | 2/2011 | Yamazaki | H01L 27/1222 |
| | | | 257/E29.296 |
| 2015/0349127 A1 | 12/2015 | Kurata et al. | |
| 2016/0093646 A1* | 3/2016 | Cha | H01L 29/78675 |
| | | | 438/157 |
| 2017/0117299 A1 | 4/2017 | Kurata et al. | |
| 2020/0234654 A1* | 7/2020 | Kim | G09G 3/3266 |
| 2020/0321360 A1 | 10/2020 | Kurata et al. | |

OTHER PUBLICATIONS

Indian Office Action, Industrial Property Office Patent Application No. 202114037217, dated Jun. 23, 2022, 5 pages.

\* cited by examiner

THIN FILM TRANSISTOR AND DISPLAY APPARATUS COMPRISING THE SAME

CROSS-REFERENCE TO RELATED APPLICATIONS

This patent application claims priority under 35 U.S.C. § 119(a) to Republic of Korea Patent Application No. 10-2020-0174708 filed on Dec. 14, 2020, which is incorporated by reference herein in its entirety.

BACKGROUND

Technical Field

The present disclosure relates to a thin film transistor and a display apparatus comprising the same.

Description of the Related Art

Since a thin film transistor may be manufactured on a glass substrate or a plastic substrate, the thin film transistor has been widely used as a switching element or a driving element of a display device such as a liquid crystal display device or an organic light emitting device.

The thin film transistor may be categorized, based on a material constituting the active layer, into an amorphous silicon thin film transistor in which amorphous silicon is used as an active layer, a polycrystalline silicon thin film transistor in which polycrystalline silicon is used as an active layer, and an oxide semiconductor thin film transistor in which oxide semiconductor is used as an active layer.

Since amorphous silicon may be deposited in a short time to form an active layer, an amorphous silicon thin film transistor (a-Si TFT) has advantages in that a manufacturing process time is short and a production cost is low. On the other hand, the amorphous silicon thin film transistor has a drawback in that a current driving capacity is not good due to low mobility and there is a change in a threshold voltage, so it is restrictively used for an active matrix organic light emitting diode (AMOLED).

A polycrystalline silicon thin film transistor (poly-Si TFT) is made by depositing amorphous silicon and crystallizing the deposited amorphous silicon. The polycrystalline silicon thin film transistor has advantages in that electron mobility is high, stability is excellent, thin profile and high resolution may be embodied, and power efficiency is high. Examples of the polycrystalline silicon thin film transistor include a low temperature poly silicon (LTPS) thin film transistor and a polysilicon thin film transistor. However, since a process of manufacturing the polycrystalline silicon thin film transistor needs a step of crystallizing the amorphous silicon, a manufacturing cost is increased due to the increased number of the process steps, and crystallization is required at a high temperature. Therefore, it is difficult to apply the polycrystalline silicon thin film transistor to a large-sized display device.

An oxide semiconductor thin film transistor (TFT), which has high mobility and has a large resistance change in accordance with oxygen content, has an advantage in that desired properties may easily be obtained. Further, since an oxide constituting an active layer may be grown at a relatively low temperature during a process of manufacturing the oxide semiconductor thin film transistor, the manufacturing cost of the oxide semiconductor thin film transistor is reduced. Furthermore, in view of the properties of oxide, since an oxide semiconductor is transparent, it is favorable to embody a transparent display. However, the oxide semiconductor thin film transistor has a problem in that stability and mobility are deteriorated as compared with the polycrystalline silicon thin film transistor.

In order to manufacture a display device of high resolution, if the number of pixels is increased, the number of thin film transistors for driving pixels is increased correspondingly. In order to dispose a lot of thin film transistors in a certain area, a size of the thin film transistor should be reduced. However, if the size of the thin film transistor is reduced, a channel length is also shortened, whereby driving stability of the thin film transistor may be deteriorated, or property deviation may occur between thin film transistors disposed in one display device, whereby display quality may be deteriorated.

In order that a display device and a thin film transistor are stably driven, a channel needs to have an effective channel length of a specific value or more. In case of an oxide semiconductor thin film transistor of a coplanar structure, it is important to control a conductorized area to make sure of a channel length. In the oxide semiconductor thin film transistor, the conductorized area is permeated into the channel, and if a length of the conductorized area permeated into the channel is not uniform, the effective channel length is not maintained uniformly, whereby property deviation may occur between the thin film transistors.

BRIEF SUMMARY

The present disclosure has been made in view of the above problems, and it is an object of the present disclosure to provide a thin film transistor that may have an effective channel length of a certain value by disposing an auxiliary electrode at a side of an active layer opposite to a gate electrode.

It is another object of the present disclosure to provide a thin film transistor having improved driving stability due to an auxiliary electrode overlapped with an active layer.

It is still another object of the present disclosure to provide a method for allowing a plurality of thin film transistors to have a certain driving property by disposing an auxiliary electrode overlapped with an active layer.

It is further still another object of the present disclosure to provide a display apparatus comprising a plurality of thin film transistors having an auxiliary electrode, whereby driving deviation of the plurality of thin film transistors is minimized.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor comprising an auxiliary electrode, a gate electrode and an active layer disposed between the auxiliary electrode and the gate electrode, wherein the active layer includes a channel portion overlapped with the gate electrode, a first connection portion disposed at one side of the channel portion, and a second connection portion disposed at the other side of the channel portion, and the channel portion includes a first portion overlapped with the auxiliary electrode and a second portion not overlapped with the auxiliary electrode.

The auxiliary electrode may overlap an edge of the gate electrode.

The auxiliary electrode may include a portion that does not overlap the gate electrode and overlaps the active layer.

The auxiliary electrode may be extended to the outside of an area that overlaps the gate electrode.

The gate electrode may be disposed above the auxiliary electrode.

The thin film transistor may further comprise source and drain electrodes respectively connected with the active layer, and a voltage applied to the auxiliary electrode may be higher than a voltage applied to the source electrode.

The auxiliary electrode may include a first auxiliary electrode and a second auxiliary electrode spaced apart from each other in an area that overlaps the channel portion.

The same voltage may be applied to the first auxiliary electrode and the second auxiliary electrode.

The first auxiliary electrode may overlap the channel portion, the boundary portion between the channel portion and the first connection portion, and the first connection portion.

The second auxiliary electrode may overlap the channel portion, the boundary portion between the channel portion and the second connection portion, and the second connection portion.

A spaced distance between the first auxiliary electrode and the second auxiliary electrode may define an effective channel length.

The second portion of the channel portion which is not overlapped with the auxiliary electrode may serve as an effective channel.

An overlap distance between the auxiliary electrode and the channel portion may be 1.5 μm or more.

Each of an overlap distance between the first auxiliary electrode and the channel portion and an overlap distance between the second auxiliary electrode and the channel portion may be 1.5 μm or more.

Each of the first auxiliary electrode and the second auxiliary electrode may have a width of 1.5 μm or more.

The spaced distance between the first auxiliary electrode and the second auxiliary electrode may be 2 μm or more.

The active layer may include an oxide semiconductor material.

The active layer may include a first oxide semiconductor layer, and a second oxide semiconductor layer on the first oxide semiconductor layer.

In accordance with another aspect of the present disclosure, the above and other objects can be accomplished by the provision of a display apparatus comprising a display element and the thin film transistor.

The thin film transistor may be a driving transistor for controlling a size of a current output to the display element.

In addition to the effects of the present disclosure as mentioned above, additional advantages and features of the present disclosure will be clearly understood by those skilled in the art from the above description of the present disclosure.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION DISCLOSURE

Figure 1:
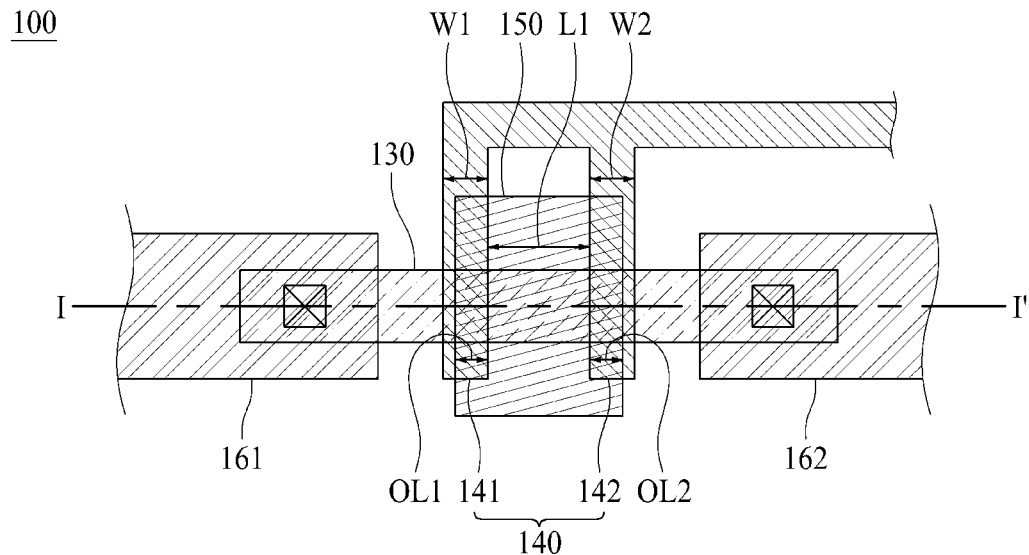
FIG. 1 is a plan view illustrating a thin film transistor according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~' 'above', 'below~' and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the device illustrated in the figure is reversed, the device described to be arranged "below", or "beneath" another device may be arranged "above" another device. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region may be a source electrode, and a drain region may be a drain electrode. Also, a source region may be a drain electrode, and a drain region may be a source electrode.

Figure 2:
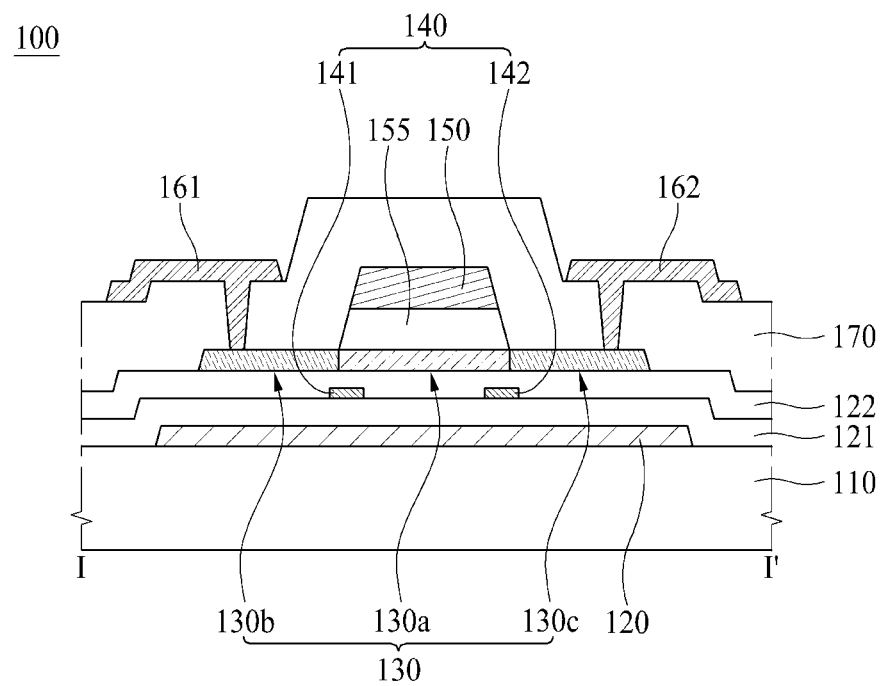
FIG. 2 is a cross-sectional view taken along line I-I' of FIG. 1.

FIG. 1 is a plan view illustrating a thin film transistor 100 according to one embodiment of the present disclosure, and FIG. 2 is a cross-sectional view taken along line I-I' of FIG. 1.

The thin film transistor 100 according to one embodiment of the present disclosure includes an auxiliary electrode 140, an active layer 130, and a gate electrode 150.

Referring to FIG. 2, the auxiliary electrode 140, the active layer 130 and the gate electrode 150 are disposed on a substrate 110.

A glass substrate or a polymer resin substrate may be used as the substrate 110. An example of the polymer resin substrate includes a plastic substrate. The plastic substrate may include at least one of polyimide (PI), polycarbonate (PC), polyethylene (PE), polyester, polyethylene terephthalate (PET) and polystyrene (PS), which have flexible characteristics.

Referring to FIG. 2, a light shielding layer 120 may be disposed on the substrate 110. The light shielding layer 120 has a light-shielding characteristic. The light shielding layer 120 may protect the active layer 130 by shielding incident light from the substrate 110. The light shielding layer 120 may be omitted.

A first buffer layer 121 is disposed on the light shielding layer 120. The first buffer layer 121 covers an upper surface of the substrate 110 and an upper surface of the light shielding layer 120. The first buffer layer 121 has insulation property, and protects the active layer 130. If the light shielding layer 120 is omitted, the first buffer layer 121 may also be omitted.

The auxiliary electrode 140 is disposed on the first buffer layer 121. Referring to FIGS. 1 and 2, the auxiliary electrode 140 may include a first auxiliary electrode 141 and a second auxiliary electrode 142.

The auxiliary electrode 140 has conductivity. The auxiliary electrode 140 may be made of a conductive material. The auxiliary electrode 140 may include at least one of Al, Ag, Cu, Mo, Cr, Au, Ta, Nd and Ti. The auxiliary electrode 140 may have a single film structure, or may have a multi-layered film structure that includes at least two conductive films having their respective physical properties different from each other.

A second buffer layer 122 is disposed on the auxiliary electrode 140.

The second buffer layer 122 has insulation property, and insulates the auxiliary electrode 140 and the active layer 130 from each other. The second buffer layer 122 protects the active layer 130. The second buffer layer 122 may be made of the same material as that of the first buffer layer 121, or may be made of a material different from that of the first buffer layer 121.

The active layer 130 is disposed on the second buffer layer 122.

The active layer 130 is spaced apart from the auxiliary electrode 140 to partially overlap the auxiliary electrode 140.

According to one embodiment of the present disclosure, the active layer 130 includes an oxide semiconductor material. The active layer 130 is an oxide semiconductor layer made of an oxide semiconductor material, for example.

The active layer 130 may include at least one of ZO(ZnO)-based, IZO(InZnO)-based, IGZO(InGaZnO)-based, TO(SnO)-based, IGO(InGaO)-based, ITO(InSnO)- based, IGZTO(InGaZnSnO)-based, GZTO(GaZnSnO)-based, GZO(GaZnO)-based, GO(GaO)-based, IO(InO)-based, FIZO(FeInZnO)-based and ITZO(InSnZnO)-based oxide semiconductor materials. In more detail, the active layer 130 may include at least one of ZO(ZnO)-based, IZO(InZnO)-based, IGZO(InGaZnO)-based, IGZTO(InGaZnSnO)-based, FIZO(FeInZnO)-based and IGTO(InGaSnO)-based oxide semiconductor materials.

The active layer 130 may have a single film structure, or may have a multi-layered film structure that includes two or more oxide semiconductor layers.

According to one embodiment of the present disclosure, the active layer 130 includes a channel portion 130a, a first connection portion 130b and a second connection portion 130c.

The channel portion 130a overlaps the gate electrode 150. The first connection portion 130b and the second connection portion 130c may be formed by selective conductorization of the active layer 130. The first connection portion 130b and the second connection portion 130c are generally disposed at both sides of the channel portion 130a. In detail, the first connection portion 130b may be disposed at one side of the channel portion 130a, and the second connection portion 130c may be disposed at the other side of the channel portion 130a.

A gate insulating film 155 is disposed on the active layer 130. The gate insulating film 155 may include at least one of silicon oxide and silicon nitride. The gate insulating film 155 may have a single film structure or a multi-layered film structure. Also, the gate insulating film 155 may be patterned as shown in FIG. 2 and then disposed on only a portion of the active layer 130. However, embodiment of the present disclosure is not limited to the example of FIG. 2, and the gate insulating film 155 may be disposed to cover an entire upper surface of the active layer 130, or may be disposed to cover an entire upper surface of the substrate 110.

The gate electrode 150 is disposed on the gate insulating film 155. The gate electrode 150 is spaced apart from the active layer 130 to overlap at least a portion of the active layer 130. The gate electrode 140 overlaps the channel portion 130a of the active layer 130.

The gate electrode 150 may include at least one of Al, Al-based metal such as Al alloy, Ag, Ag-based metal such as Ag alloy, Cu, Cu-based metal such as Cu alloy, Mo, Mo-based metal such as Mo alloy, Cr, Au, Ta, Nd and Ti. The gate electrode 150 may have a multi-layered film structure that includes at least two conductive films having their respective physical properties different from each other.

Referring to FIGS. 1 and 2, at least a portion of the auxiliary electrode 140 overlaps at least a portion of the gate electrode 150.

According to one embodiment of the present disclosure, as shown in FIG. 2, the active layer 130 is disposed between the auxiliary electrode 140 and the gate electrode 150. Also, referring to FIGS. 1 and 2, the channel portion 130a of the active layer 130 includes a portion that overlaps the gate electrode 150 but does not overlap the auxiliary electrode 140.

Referring to FIG. 2, an inter-layer dielectric film 170 is disposed on the gate electrode 150. The inter-layer dielectric film 170 is an insulating layer made of an insulating material. In detail, the inter-layer dielectric film 170 may be made of an organic material or an inorganic material, or may be made of a stacked layer of an organic layer and an inorganic layer.

A source electrode 161 and a drain electrode 162 are disposed on the inter-layer dielectric film 170. The source electrode 161 and the drain electrode 162 are spaced apart from each other and respectively connected with the active layer 130. The source electrode 161 and the drain electrode 162 may respectively be connected with the active layer 130 through a contact hole passing through the inter-layer dielectric film 170.

Each of the source electrode 161 and the drain electrode 162 may include at least one of Mo, Al, Cr, Au, Ti, Ni, Nd, Cu and their alloy. Each of the source electrode 161 and the drain electrode 162 may be comprised of a single layer made of metal or metal alloy, or may be comprised of a multi-layer of two or more layers.

Hereinafter, an arrangement relationship of the auxiliary electrode 140, the active layer 130 and the gate electrode 150 will be described in more detail.

According to one embodiment of the present disclosure, the active layer 130 may selectively be conductorized by using the gate electrode 150 as a mask.

An area of the active layer 130, which overlaps the gate electrode 150, is not conductorized and thus becomes the channel portion 130a. The channel portion 130a has semiconductor characteristics.

An area of the active layer 130, which does not overlap the gate electrode 150, is conductorized and thus becomes the first connection portion 130b and the second connection portion 130c.

According to one embodiment of the present disclosure, the active layer 130 may selectively be conductorized by plasma treatment or dry-etching, for example. However, embodiment of the present disclosure is not limited to the above example, and the active layer 130 may selectively be conductorized by doping based on a dopant. In this case, the doped area is conductorized. For doping, for example, at least one of B ion, P ion, As ion and Sb ion may be used. Also, the active layer 130 may be selectively conductorized by light irradiation.

According to one embodiment of the present disclosure, any one of the first connection portion 130b and the second connection portion 130c may be a source region, and the other one may be a drain region. The source region serves as a source connector connected with the source electrode 161. The drain region serves as a drain connector connected with the drain electrode 162.

The first connection portion 130b and the second connection portion 130c, which are shown, are distinguished from each other for convenience of description but may be used interchangeably. According to one embodiment of the present disclosure, the first connection portion 130b may be a source region, and the second connection portion 130c may be a drain region. Also, the first connection portion 130b may be a drain region, and the second connection portion 130c may be a source region.

According to one embodiment of the present disclosure, the first connection portion 130b may serve as a source electrode or a drain electrode. Also, the second connection portion 130c may serve as a drain electrode or a source electrode.

According to one embodiment of the present disclosure, the auxiliary electrode 140 overlaps a part of the channel portion 130a.

According to one embodiment of the present disclosure, the auxiliary electrode 140 may include a first auxiliary electrode 141 and a second auxiliary electrode 142. The first auxiliary electrode 141 and the second auxiliary electrode 142 may overlap the channel portion 130a. The first auxiliary electrode 141 and the second auxiliary electrode 142 are spaced apart from each other in an area that overlaps the channel portion 130a.

According to one embodiment of the present disclosure, the auxiliary electrode 140 overlaps an edge of the gate electrode 150. Generally, the edge means a boundary of some element. As the case may be, the edge may include a boundary of some element and an area adjacent to the boundary. In one embodiment of the present disclosure, the edge is defined as a boundary of some element.

According to one embodiment of the present disclosure, the auxiliary electrode 140 overlaps at least a portion of the edge of the gate electrode 150.

Referring to FIGS. 1 and 2, the auxiliary electrode 140 includes a portion that overlaps the active layer 130 without overlapping the gate electrode 150. Also, referring to FIGS. 1 and 2, at least a portion of the auxiliary electrode 140 may be extended to the outside of the area that overlaps the gate electrode 150.

In FIGS. 1 and 2, a portion of the first auxiliary electrode 141, which is extended to the outside of the gate electrode 150, and a portion of the second auxiliary electrode 142, which is extended to the outside of the gate electrode 150, may correspond to the portion of the auxiliary electrode 140, which overlaps the active layer 130 without overlapping the gate electrode 150.

According to one embodiment of the present disclosure, the auxiliary electrode 140 may be overlapped with the active layer 130, and thus may serve as an auxiliary gate electrode.

In more detail, the auxiliary electrode 140 may be disposed at the edge of the channel portion 130a of the active layer 130 and near the edge of the channel portion 130a, and thus may serve as the auxiliary gate electrode. According to one embodiment of the present disclosure, a voltage similar to a gate-ON voltage may be applied to the auxiliary electrode 140. For example, a threshold voltage Vth or more of the thin film transistor 100 may be applied to the auxiliary electrode 140.

The same voltage may be applied to the first auxiliary electrode 141 and the second auxiliary electrode 142, which constitute the auxiliary electrode 140. A voltage higher than that of the source electrode 161 may commonly be applied to the first auxiliary electrode 141 and the second auxiliary electrode 142.

According to one embodiment of the present disclosure, the voltage higher than that of the source electrode 161 may be applied to the auxiliary electrode 140. If the voltage applied to the auxiliary electrode 140 is higher than that applied to the source electrode 161, "Vauxiliary electrode-VS>0" is established, whereby an effect that the gate-ON voltage is applied to the auxiliary electrode 140 may be obtained. In this case, the auxiliary electrode 140 may serve as a lower gate electrode. Also, a double gate structure may be formed by the auxiliary electrode 140 and the gate electrode 150.

According to one embodiment of the present disclosure, at least one of a boundary portion between the channel portion 130a and the first connection portion 130b and a boundary portion between the channel portion 130a and the second connection portion 130c may overlap the auxiliary electrode 140.

Also, the auxiliary electrode 140 may be extended to the outside of the area that overlaps the channel portion 130a to overlap at least one of the first connection portion 130b and the second connection portion 130c.

Referring to FIGS. 1 and 2, the first auxiliary electrode 140 overlaps the boundary portion between the channel portion 130a and the first connection portion 130b. In more detail, referring to FIGS. 1 and 2, the first auxiliary electrode 141 overlaps the channel portion 130a, the boundary portion between the channel portion 130a and the first connection portion 130b, and the first connection portion 130b.

Referring to FIGS. 1 and 2, the second auxiliary electrode 142 overlaps the boundary portion between the channel portion 130a and the second connection portion 130c. In more detail, referring to FIGS. 1 and 2, the second auxiliary electrode 142 overlaps the channel portion 130a, the boundary portion between the channel portion 130a and the second connection portion 130c, and the second connection portion 130c.

However, embodiment of the present disclosure is not limited to the above example, and the first auxiliary electrode 141 may overlap the channel portion 130a, the boundary portion between the channel portion 130a and the second connection portion 130c, and the second connection portion 130c, and the second auxiliary electrode 142 may overlap the channel portion 130a, the boundary portion between the channel portion 130a and the first connection portion 130b, and the first connection portion 130b.

According to one embodiment of the present disclosure, an effective channel length may be defined by a spaced distance L1 between the first auxiliary electrode 141 and the second auxiliary electrode 142. According to one embodiment of the present disclosure, the spaced distance L1 between the first auxiliary electrode 141 and the second auxiliary electrode 142 may be an effective channel length.

The auxiliary electrode 140, which includes the first auxiliary electrode 141 and the second auxiliary electrode 142, may be patterned very finely by improvement of photolithography and etching technologies. Therefore, a width W1 of the first auxiliary electrode 141, a width W2 of the second auxiliary electrode 142 and the spaced distance L1 between the first auxiliary electrode 141 and the second auxiliary electrode 142 may be controlled very finely.

According to one embodiment of the present disclosure, the first connection portion 130b and the second connection portion 130c may be formed by selective conductorization for the active layer 130, and the portion that is not conductorized becomes the channel portion 130a. Therefore, according to one embodiment of the present disclosure, the channel portion 130a is defined by conductorization. For example, if conductorization is performed using the gate electrode 150 as a mask, the area of the active layer 130, which overlaps the gate electrode 150, will be the channel portion 130a that is not conductorized.

However, in the conductorizing process, the area of the active layer 130, which overlaps the gate electrode 150, is affected by conductorization. For example, in the process for treatment of plasma, dry-etching or doping based on a dopant applied for conductorization, the area which will become the channel portion 130a may partially be affected by conductorization. As a result, the channel portion 130a defined as an area that overlaps the gate electrode 150 may partially be conductorized. For example, the area of the channel portion 130a, which is adjacent to the first connection portion 130b or the second connection portion 130c, may partially be conductorized. For this reason, it may be difficult to calculate an effective channel length. Particularly, in a display apparatus in which a plurality of thin film transistors are disposed on one substrate 110, effective channel lengths of the thin film transistors may not be equal to one another, whereby deviation in the effective channel lengths may occur. If deviation in the effective channel lengths of the thin film transistors occurs, difference in characteristics of the thin film transistors may occur.

Hereinafter, conductorization and deviation in effective channel lengths will be described in more detail with reference to FIGS. 3 and 4.

Figure 3:
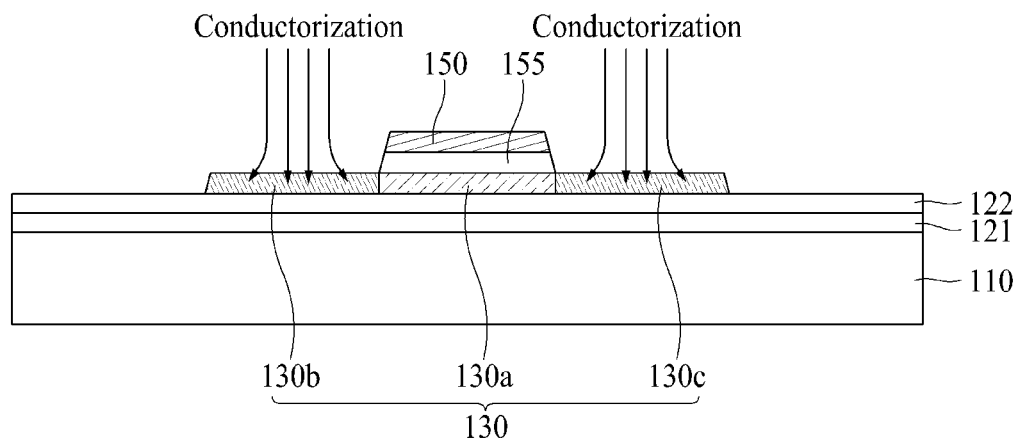
FIG. 3 is a schematic diagram illustrating a conductorizing method.
Figure 4:
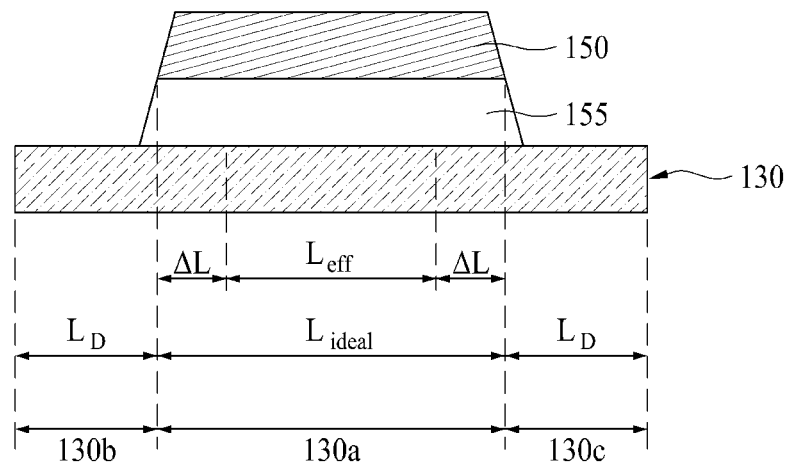
FIG. 4 is a schematic diagram illustrating a conductorization permeation depth ΔL.

FIG. 3 is a schematic diagram illustrating a conductorizing method, and FIG. 4 is a schematic diagram illustrating a conductorization permeation depth ΔL.

Referring to FIG. 3, the active layer 130 may be selectively conductorized by using the gate electrode 150 as a mask. For example, conductorization may be performed by dry-etching, plasma treatment or doping.

According to the method shown in FIG. 3, the channel portion 130a may partially be conductorized by selective conductorization for the active layer 130 in the process of forming the first connection portion 130b or the second connection portion 130c. For example, the area of the channel portion 130a, which is adjacent to the first connection portion 130b or the second connection portion 130c, may be conductorized. However, in the conductorizing process, it is not easy to determine whether the edge of the channel portion 130a and an area adjacent to the edge of the channel portion 130a have been conductorized.

A length or distance where the channel portion 130a is conductorized in the conductorizing process will be referred to as a conductorization permeation depth ΔL.

FIG. 4 is a schematic diagram illustrating the conductorization permeation depth ΔL.

Referring to FIG. 4, a length of the channel portion 130a of the active layer 130, which overlaps the gate electrode 150, is marked as "$L_{ideal}$". "$L_{ideal}$" of FIG. 4 may be considered as an ideal length of the channel portion 130a. In FIG. 4, "$L_D$" denotes a length of the first connection portion 130b or the second connection portion 130c.

In the selective conductorization process for the active layer 130, the channel portion 130a is partially conductorized, and the conductorized area fails to serve as a channel. In FIG. 4, a conductorization permeation depth which is a length of the conductorized portion of the channel portion 130a is marked as "ΔL". Also, a length of an area of the channel portion 130a, which may effectively serve as a channel without being conductorized, is referred to as an effective channel length $L_{eff}$. If the conductorization permeation depth ΔL is increased, the effective channel length $L_{eff}$ is reduced.

In order that the thin film transistor serves to perform a switching function, the effective channel length $L_{eff}$ should be maintained at a predetermined value or more. However, if it is not determined how the edge of the channel portion 130a is conductorized, it is difficult to design the length of the channel portion 130a. When considering an error in this design, the channel portion 130a should be designed with a long length to make sure of a predetermined effective channel length $L_{eff}$. In this case, the size of the thin film transistor may be increased, and it may be difficult to miniaturize and integrate an element.

According to one embodiment of the present disclosure, the auxiliary electrode 140 is disposed to overlap the edge of the channel portion 130a. According to one embodiment of the present disclosure, since the voltage higher than that of the source electrode 161 is applied to the auxiliary electrode 140, the effect like that the gate-ON voltage is applied to the auxiliary electrode 140 is obtained. In this case, the area of the channel portion 130a, which overlaps the auxiliary electrode 140, may have conductivity similar to a conductor. Therefore, if a length of an area where the auxiliary electrode 140 and the channel portion 130a overlap each other is longer than the conductorization permeation depth ΔL that is experimentally obtained, the area of the channel portion 130a, which does not overlap the auxiliary electrode 140, for example, the area between the first auxiliary electrode 141 and the second auxiliary electrode 142 may serve as a channel. As a result, the effective channel length $L_{eff}$ may definitely be defined.

According to one embodiment of the present disclosure, the distance L1 between the first auxiliary electrode 141 and the second auxiliary electrode 142 becomes the effective channel length $L_{eff}$. In this way, according to one embodiment of the present disclosure, since the effective channel length $L_{eff}$ is definitely specified, it is easy to determine and design the length of the channel portion 130a. Also, according to one embodiment of the present disclosure, the auxiliary electrode 140 may be disposed in the thin film transistor 100, such that the effective channel length of the thin film transistor 100 may definitely be defined, whereby performance deviation of the thin film transistor may be minimized.

According to one embodiment of the present disclosure, the width W1 of the auxiliary electrode 140 or the first auxiliary electrode 141 and the width W2 of the second auxiliary electrode 142 may be determined by the conductorization permeation depth ΔL to make sure of the effective channel length $L_{eff}$. The conductorization permeation depth ΔL may be varied depending on a length, a thickness, a conductorizing method, etc. of the channel portion 130a.

According to one embodiment of the present disclosure, the length of the area where the auxiliary electrode 140 and the channel portion 130a overlap each other may be set to 1.5 μm or more. For example, OL1 or OL2, which corresponds to the length of the area where the auxiliary electrode 140 and the channel portion 130a overlap each other, may be 1.5 μm or more. Considering that the auxiliary electrode 140 is disposed at both sides of the channel portion 130a, a length OL1+OL2 of the area where the auxiliary electrode 140 and the channel portion 130a overlap each other may be set in the range of 3.0 μm or more. If the length OL1+OL2 of the area where the auxiliary electrode 140 and the channel portion 130a overlap each other is set to 3.0 μm or more, the conductorization permeation depth ΔL may be covered by the auxiliary electrode 140. For example, the length of the area where the auxiliary electrode 140 and the channel portion 130a overlap each other may be set in the range of 1.5 μm to 7 μm, or may be set in the range of 3.0 μm to 7 μm.

The conductorization permeation depth ΔL at any one side of the channel portion 130a may be about 1.5 μm. Therefore, according to one embodiment of the present disclosure, an overlap distance OL1 between the first auxiliary electrode 141 and the channel portion 130a may be set to 1.5 μm or more, for example, may be set in the range of 1.5 μm to 3.5 μm. An overlap distance OL2 between the second auxiliary electrode 142 and the channel portion 130a may also be set in the range of 1.5 μm to 3.5 μm.

Considering an error in the manufacturing process, a portion of the first auxiliary electrode 141 and a portion of the second auxiliary electrode 142 may be protruded to the outside of the channel portion 130a. In this way, if a portion of the first auxiliary electrode 141 and a portion of the second auxiliary portion 142 are protruded to the outside of the channel portion 130a, the first auxiliary electrode 141 and the second auxiliary electrode 142 may stably cover the conductorization permeation depth ΔL at both sides of the channel portion 130a. Considering such an error in the manufacturing process, the first auxiliary electrode 141 and the second auxiliary electrode 142 may have widths W1 and W2 of 1.5 µm or more, respectively. For example, the width W1 of the first auxiliary electrode 141 and the width W2 of the second auxiliary electrode 142 may range from 1.5 µm to 4.0 µm, respectively.

According to one embodiment of the present disclosure, the effective channel length Leff may be set to 2 µm or more, 3 µm or more, or 4 µm or more. According to one embodiment of the present disclosure, the spaced distance L1 between the first auxiliary electrode 141 and the second auxiliary electrode 142 may be set to 2 µm or more. The spaced distance L1 between the first auxiliary electrode 141 and the second auxiliary electrode 142 may be set to 3 µm or more, or may be set to 4 µm or more. Also, the spaced distance L1 between the first auxiliary electrode 141 and the second auxiliary electrode 142 may be set to 15 µm or less, 10 µm or less, 7 µm or less, 6 µm or less, or 5 µm or less.

Figure 5:
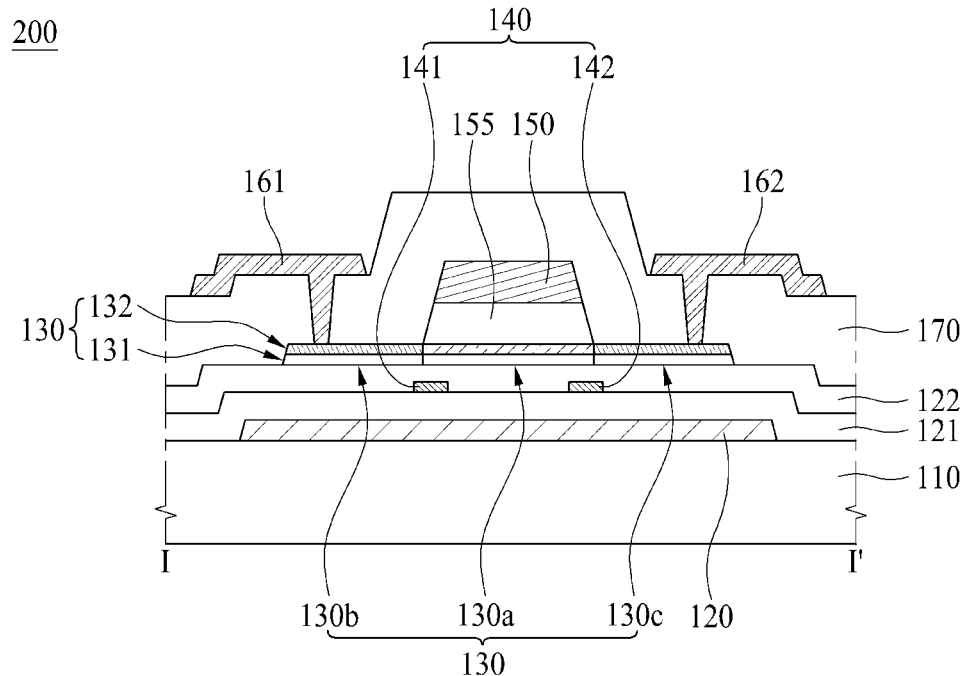
FIG. 5 is a cross-sectional view illustrating a thin film transistor according to another embodiment of the present disclosure.

FIG. 5 is a cross-sectional view illustrating a thin film transistor 200 according to another embodiment of the present disclosure.

Referring to FIG. 5, the active layer 130 may include a first oxide semiconductor layer 131 and a second oxide semiconductor layer 132 on the first oxide semiconductor layer 131.

The first oxide semiconductor layer 131 may be disposed on the second buffer layer 122, and may serve as a support layer for supporting the second oxide semiconductor layer 132. The second oxide semiconductor layer 132 may serve as a main channel layer.

The first oxide semiconductor layer 131 serving as a support layer may have excellent film stability and mechanical stability. The first oxide semiconductor layer 131, for example, may include at least one of IGZO(InGaZnO)-based, IGO(InGaO)-based, IGZTO(InGaZnSnO)-based, GZTO(GaZnSnO)-based, GZO(GaZnO)-based and GO(GaO)-based oxide semiconductor materials. However, embodiment of the present disclosure is not limited to this example, and the first oxide semiconductor layer 131 may be made of another oxide semiconductor material known in the art.

The second oxide semiconductor layer 132, for example, may be made of at least one of IZO(InZnO)-based, FIZO(FeInZnO)-based, TO(SnO)-based, IGO(InGaO)-based, ITO(InSnO)-based, IGZO(InGaZnO)-based, IGZTO(InGaZnSnO)-based, GZTO(GaZnSnO)-based, ITZO (InSnZnO)-based, FIGZO(FeInGaZnO)-based and IO(InO)-based oxide semiconductor materials. However, embodiment of the present disclosure is not limited to this example, and the second oxide semiconductor layer 132 may be made of another oxide semiconductor material known in the art.

Referring to FIG. 5, the gate insulating film 155 may be patterned. The gate insulating film 155, for example, may be patterned in a shape corresponding to the gate electrode 150.

The auxiliary electrode 140 is disposed between the substrate 110 and the active layer 130.

According to another embodiment of the present disclosure, the auxiliary electrode 140 may include an area that overlaps the gate electrode 150, and an area that does not overlap the gate electrode 150.

Figure 6:
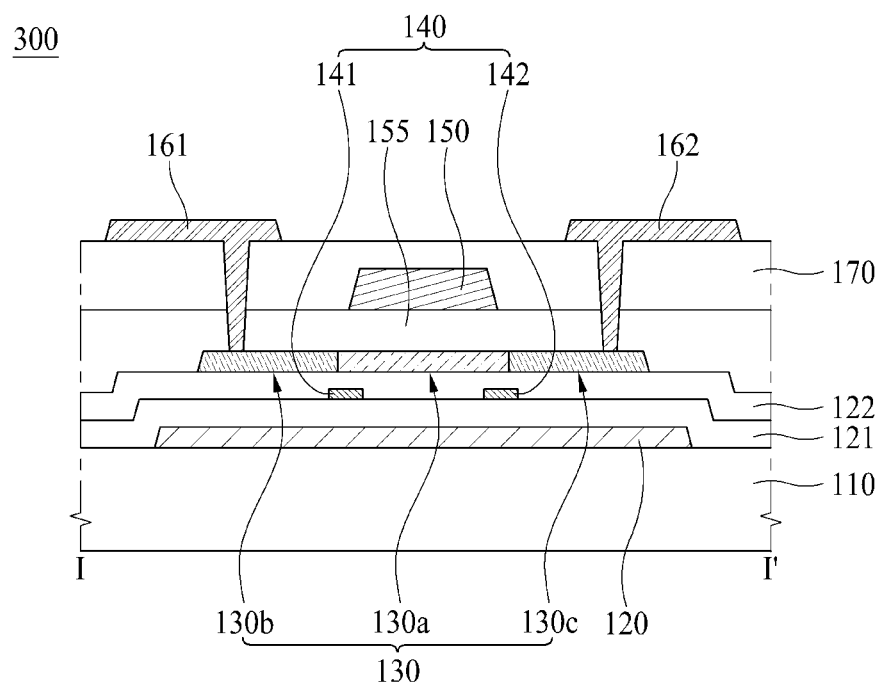
FIG. 6 is a cross-sectional view illustrating a thin film transistor according to still another embodiment of the present disclosure.

FIG. 6 is a cross-sectional view illustrating a thin film transistor 300 according to still another embodiment of the present disclosure.

Referring to FIG. 6, the gate insulating film 155 covers an entire upper surface of the active layer 130 without being patterned. Also, the gate insulating film 155 may fully cover an upper portion of the substrate 110.

If the gate insulating film 155 covers the entire upper surface of the active layer 130 without being patterned, the active layer 130 may be selectively conductorized by doping based on a dopant. As a result, the first connection portion 130b and the second connection portion 130c may be formed by conductorization of the active layer 130 even though the gate insulating film 155 is not patterned.

Figure 7:
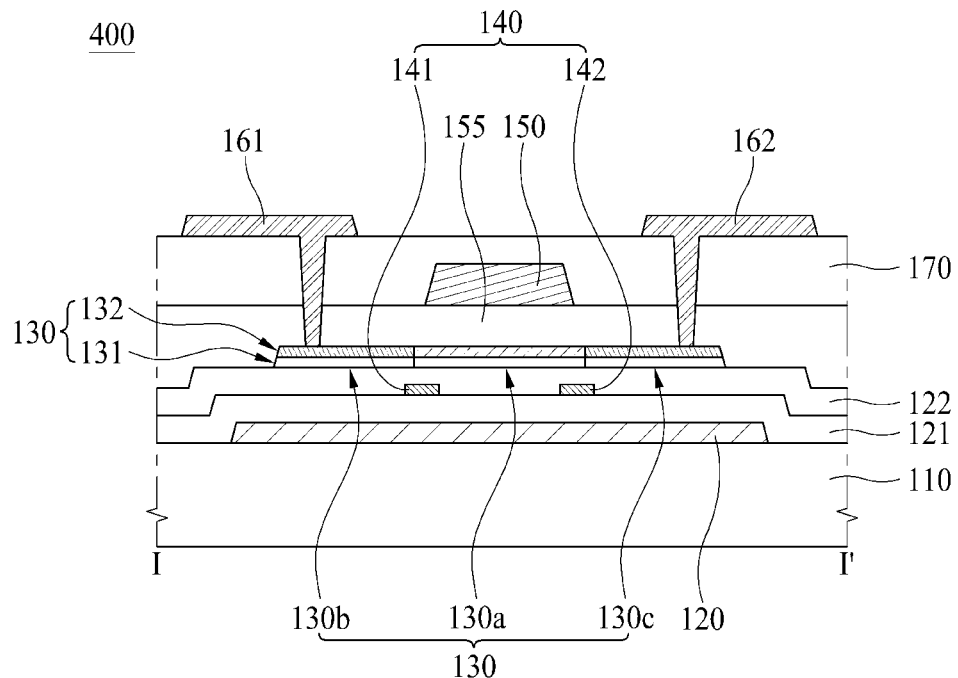
FIG. 7 is a cross-sectional view illustrating a thin film transistor according to further still another embodiment of the present disclosure.

FIG. 7 is a cross-sectional view illustrating a thin film transistor 400 according to still another embodiment of the present disclosure.

Referring to FIG. 7, the active layer 130 may include a first oxide semiconductor layer 131 and a second oxide semiconductor layer 132 on the first oxide semiconductor layer 131. Also, the gate insulating film 155 may cover an entire upper surface of the active layer 130 without being patterned. The gate insulating film 155 may fully cover the upper portion of the substrate 110.

Figure 8:
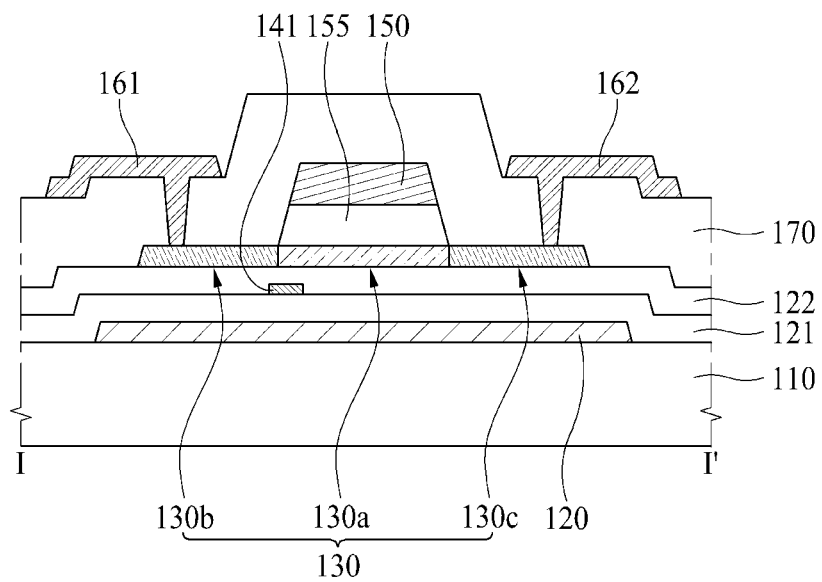
FIG. 8 is a cross-sectional view illustrating a thin film transistor according to further still another embodiment of the present disclosure.

FIG. 8 is a cross-sectional view illustrating a thin film transistor 500 according to still another embodiment of the present disclosure.

Referring to FIG. 8, the auxiliary electrode 140 may include only a first auxiliary electrode 141. The first auxiliary electrode 141 overlaps any one edge of the channel portion 130a. In FIG. 8, the first auxiliary electrode 141 becomes the auxiliary electrode 140.

Referring to FIG. 8, the first auxiliary electrode 141 overlaps the channel portion 130a, the boundary portion between the channel portion 130a and the first connection portions 130b, and the first connection portion 130b. However, embodiment of the present disclosure is not limited to this example, and the first auxiliary electrode 141 may overlap the channel portion 130a, the boundary portion between the channel portion 130a and the second connection portion 130c, and the second connection portion 130c.

According to further still another embodiment of the present disclosure, the overlap distance between the first auxiliary electrode 141 and the channel portion 130a may range from 1.5 µm to 3.5 µm.

Considering an error in the manufacturing process, a portion of the first auxiliary electrode 141 may protrude to the outside of the channel portion 130a. Considering such an error in the manufacturing process, the first auxiliary electrode 141 may have a width ranging from 1.5 µm to 4.0 µm.

Figure 9:
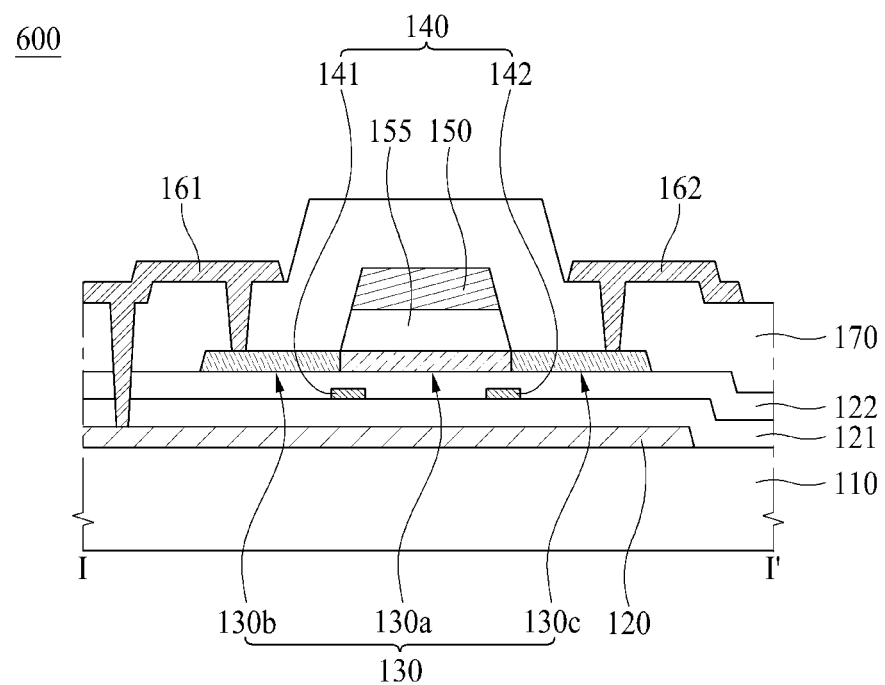
FIG. 9 is a cross-sectional view illustrating a thin film transistor according to further still another embodiment of the present disclosure.

FIG. 9 is a cross-sectional view illustrating a thin film transistor 600 according to further still another embodiment of the present disclosure.

Referring to FIG. 9, the light shielding layer 120 may be connected with the source electrode 161. As the light shielding layer 120 is connected with the source electrode 161, electric stability of the thin film transistor 600 may be improved as compared with a floating state of the light shielding layer 120.

In further still another embodiment of the present disclosure, the floating state means the state that an element is not connected with another element electrically. In one embodiment of the present disclosure, the floating state of the light-shielding layer 120 means the state that the light shielding layer 120 is electrically disconnected without being electrically connected with another element.

If the light shielding layer 120 is in a floating state, the light shielding layer 120 may be affected by an electric field formed by another element. In this case, the light shielding layer 120 may be subjected to electrical charge or electrostatic induction. In this way, if the light shielding layer 120 is subjected to electrical charge or electrostatic induction, the light shielding layer 120 may electrically affect another element of the thin film transistor 600, whereby electrical stability of the thin film transistor 600 is deteriorated.

Therefore, according to still another embodiment of the present disclosure, the light shielding layer 120 is connected with the source electrode 161, whereby electrical instability due to the light shielding layer 120 may be minimized.

Figure 10:
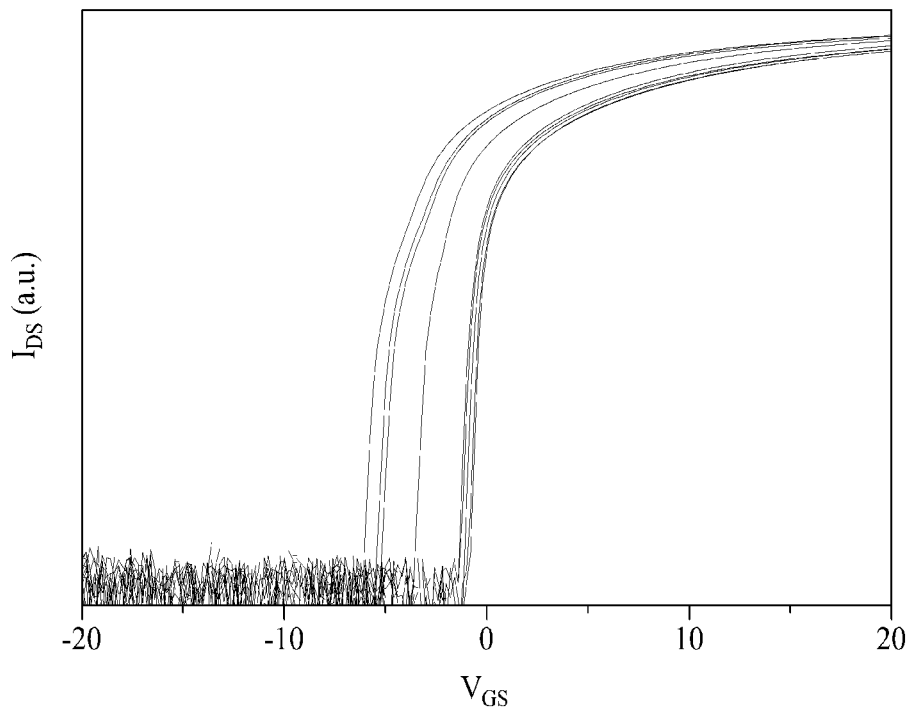
FIG. 10 is a threshold voltage graph of thin film transistors according to a comparison example.
Figure 11:
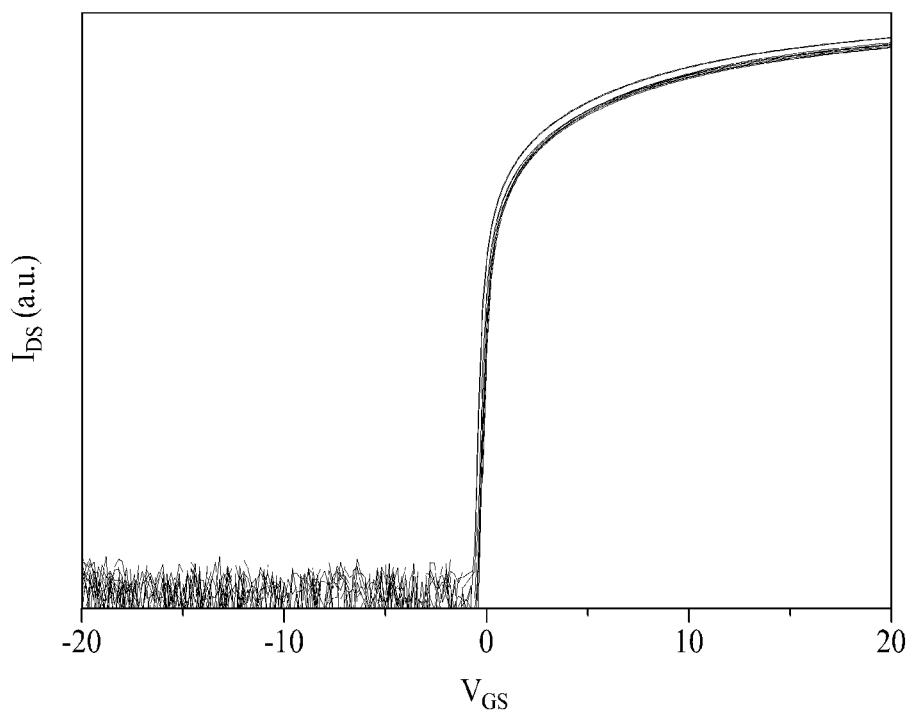
FIG. 11 is a threshold voltage graph of thin film transistors according to one embodiment of the present disclosure.

FIG. 10 is a threshold voltage graph of thin film transistors according to a comparison example, and FIG. 11 is a threshold voltage graph of thin film transistors 100 according to one embodiment of the present disclosure.

The thin film transistor according to the comparison example does not include an auxiliary electrode 140.

FIGS. 10 and 11 illustrate threshold voltage graphs measured for nine thin film transistors formed on one mother glass.

In more detail, as an embodiment, after nine thin film transistors 100 including an oxide semiconductor layer 130, which is made of In, Ga and Zn mixed at a ratio of 4:1:4 (ratio of atoms), a first auxiliary electrode 141 and a second auxiliary electrode 142 and having the structure of FIGS. 1 and 2 are manufactured on one mother glass, their threshold voltages Vth are measured and the measured results are shown in FIG. 11.

As a comparison example, after nine thin film transistors, which do not include a first auxiliary electrode 141 and a second auxiliary electrode 142, are manufactured on one mother glass, their threshold voltages Vth are measured and the measured results are shown in FIG. 10.

For measurement of the threshold voltage Vth, a drain current $I_DS$ of the thin film transistors according to the comparison example and the embodiment has been measured while a gate voltage VGS ranging from −20V to +20V is being applied. The voltage of 20V has been applied between the source electrode 161 and the drain electrode 162. Nine threshold voltages Vth have been measured for each of the comparison example and the embodiment.

Referring to FIG. 10, it is noted that dispersion of the threshold voltages Vth of the thin film transistors according to the comparison example is high. The thin film transistors according to the comparison example have low driving stability and low reliability of the product due to low uniformity of the threshold voltages Vth.

On the other hand, referring to FIG. 11, it is noted that dispersion of the threshold voltages Vth of the thin film transistors according to the embodiment is very low. The thin film transistors according to the embodiment have excellent driving stability and reliability due to high uniformity of the threshold voltages Vth.

Figure 12:
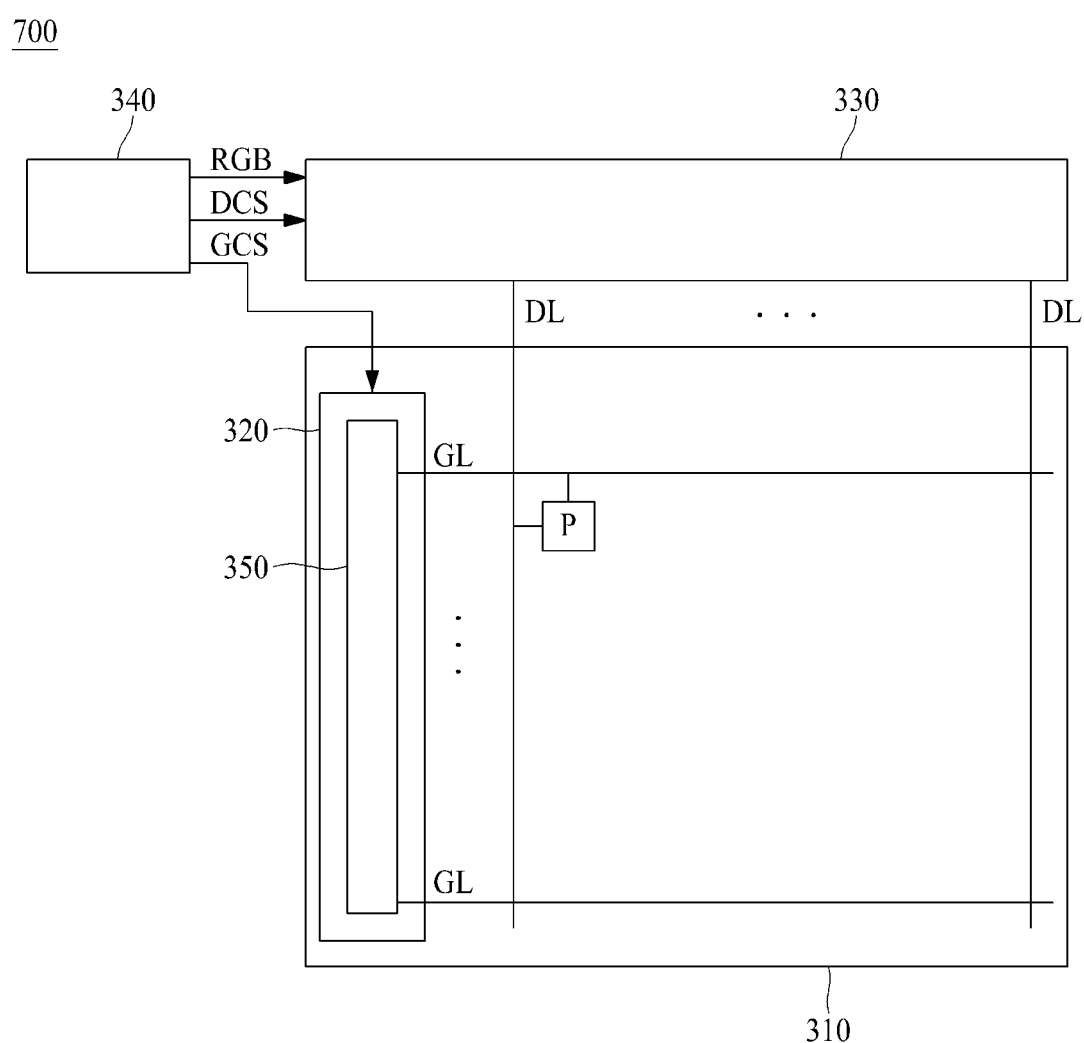
FIG. 12 is a schematic diagram illustrating a display apparatus according to another embodiment of the present disclosure.

FIG. 12 is a schematic diagram illustrating a display apparatus 700 according to another embodiment of the present disclosure.

The display apparatus 700 according to another embodiment of the present disclosure includes a display panel 310, a gate driver 320, a data driver 330, and a controller 340, as shown in FIG. 12.

Gate lines GL and data lines DL are disposed on the display panel 310, and pixels P are disposed in intersection areas between the gate lines GL and the data lines DL. An image is displayed by driving of the pixels P.

The controller 340 controls the gate driver 320 and the data driver 330.

The controller 340 outputs a gate control signal GCS for controlling the gate driver 320 and a data control signal DCS for controlling the data driver 330 by using a signal supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst, and a gate clock GCLK. Also, control signals for controlling a shift register 350 may be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. In detail, the data driver 330 converts the image data RGB input from the controller 340 to an analog data voltage and supplies the data voltage to the data lines DL.

The gate driver 320 may include a shift register 350.

The shift register 350 sequentially supplies gate pulses to the gate lines GL for one frame by using the start signal and the gate clock, which are transmitted from the controller 340. In this case, one frame means a period where one image is output through the display panel 310. The gate pulse has a turn-on voltage for turning on a switching element (thin film transistor) disposed in the pixel P.

Also, the shift register 350 supplies a gate-OFF signal capable of turning off a switching element, to the gate line GL for the other period of one frame, in which the gate pulse is not supplied. Hereinafter, the gate pulse and the gate-OFF signal will collectively be referred to as a scan signal SS or Scan.

According to one embodiment of the present disclosure, the gate driver 320 may be packaged on the substrate 110. In this way, a structure in which the gate driver 320 is directly packaged on the substrate 110 will be referred to as a Gate In Panel (GIP) structure. The gate driver 320 may include at least one of the transistors 100, 200, 300, 400, 500 and 600 according to the embodiments of the present disclosure.

Figure 13:
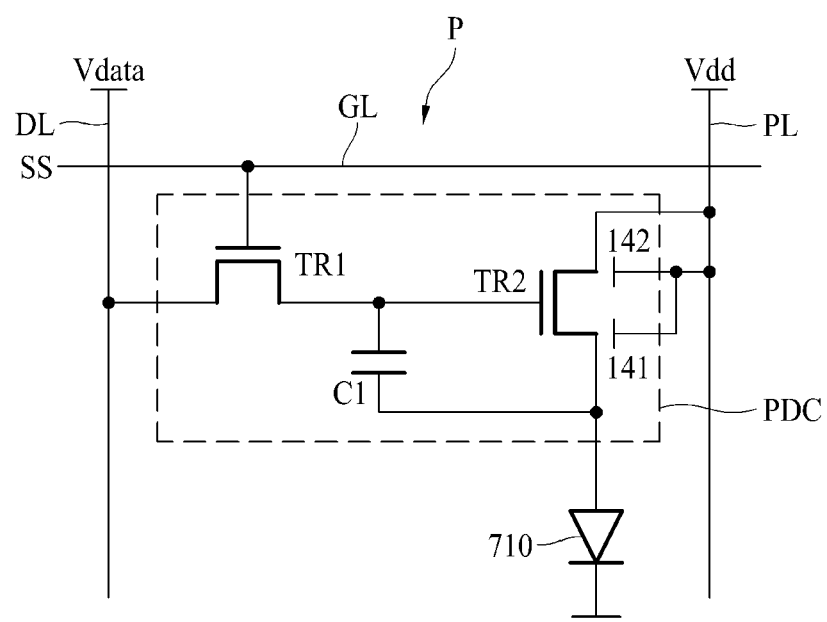
FIG. 13 is a circuit view illustrating any one pixel of FIG. 12.
Figure 14:
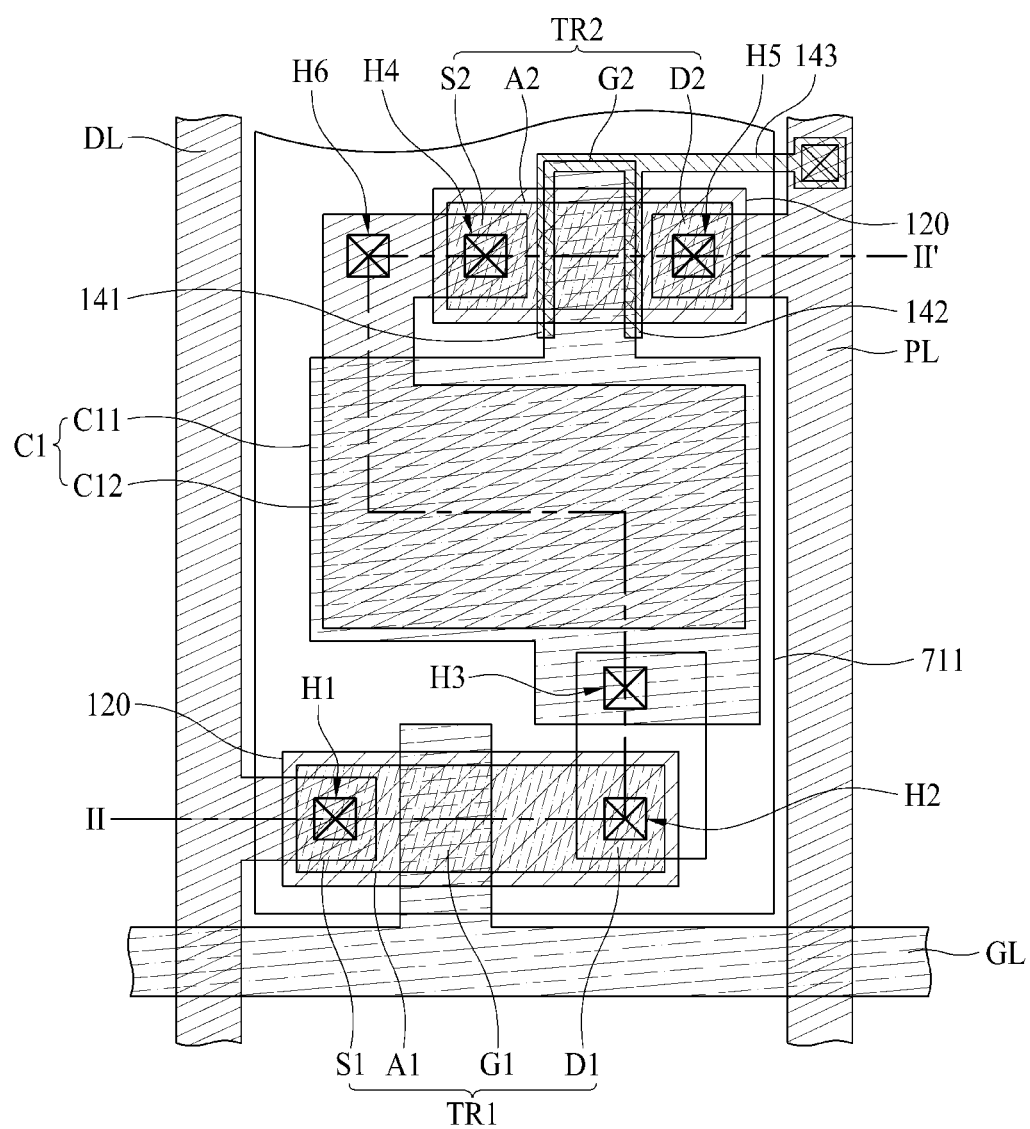
FIG. 14 is a plan view illustrating a pixel of FIG. 13.
Figure 15:
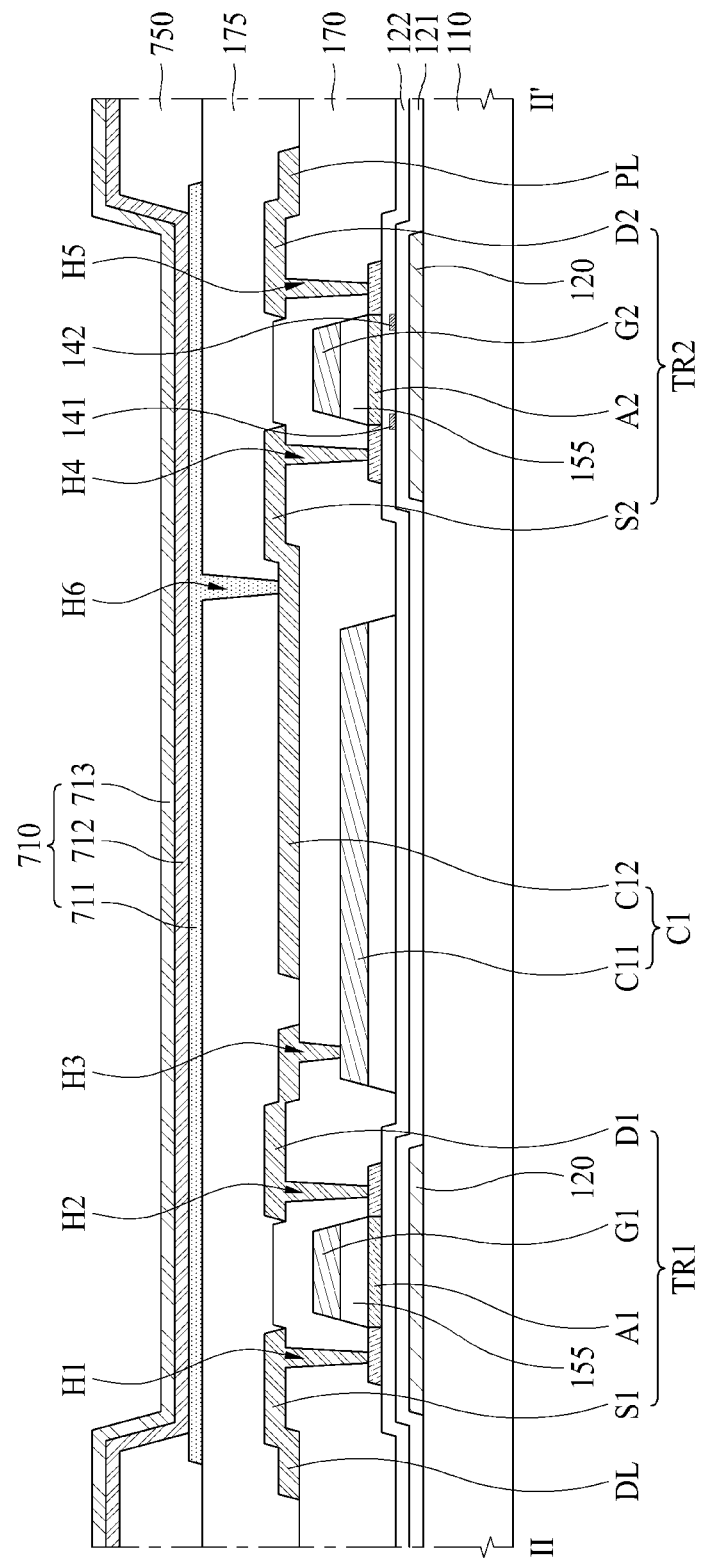
FIG. 15 is a cross-sectional view taken along line II-II' of FIG. 14.

FIG. 13 is a circuit view illustrating any one pixel P of FIG. 12, FIG. 14 is a plan view illustrating the pixel P of FIG. 13, and FIG. 15 is a cross-sectional view taken along line II-II' of FIG. 14.

The circuit view of FIG. 13 is an equivalent circuit view for a pixel P of a display apparatus 700 that includes an organic light emitting diode OLED as a display element 710.

The pixel P includes a display element 710, and a pixel driving circuit PDC for driving the display element 710.

The pixel driving circuit PDC of FIG. 13 includes a first thin film transistor TR1 that is a switching transistor, and a second thin film transistor TR2 that is a driving transistor.

The display apparatus 700 according to another embodiment of the present disclosure may include at least one of the transistors 100, 200, 300, 400, 500 and 600 according to the embodiments of the present disclosure. Any one of the transistors 100, 200, 300, 400, 500 and 600 according to the embodiments of the present disclosure may be used as the first thin film transistor TR1 or the second thin film transistor TR2.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the second thin film transistor TR2 controls applying of the driving voltage Vdd. The driving voltage Vdd is a pixel driving voltage for driving the organic light emitting diode OLED that is a display element 710.

When the first thin film transistor TR1 is turned on by the scan signal SS applied from the gate driver 320 through the gate line GL, the data voltage Vdata supplied through the data line DL is supplied to the gate electrode G2 of the second thin film transistor TR2 connected with the display element 710. The data voltage Vdata is charged in a first capacitor C1 formed between the gate electrode G2 and the source electrode S2 of the second thin film transistor TR2. The first capacitor C1 is a storage capacitor Cst.

The amount of current supplied to the organic light emitting diode OLED that is a display element 710 through the second thin film transistor TR2 is controlled in accordance with the data voltage Vdata, whereby gradation of light emitted from the display element 710 may be controlled.

Referring to FIGS. 14 and 15, the first thin film transistor TR1 and the second thin film transistor TR2 are disposed on the substrate 110.

The substrate 110 may be made of glass or plastic. Plastic having a flexible characteristic, for example, polyimide (PI) may be used as the substrate 110.

The light shielding layer 120 is disposed on the substrate 110. The light shielding layer 120 may protect active layers A1 and A2 by shielding external incident light.

The first buffer layer 121 is disposed on the light shielding layer 120. The first buffer layer 121 is made of an insulating material, and protects the active layers A1 and A2 from external moisture, oxygen, etc.

The first auxiliary electrode 141 and the second auxiliary electrode 142 are disposed on the first buffer layer 121. The first auxiliary electrode 141 and the second auxiliary electrode 142 constitute the auxiliary electrode. The first auxiliary electrode 141 and the second auxiliary electrode 142 have conductivity. The first auxiliary electrode 141 and the second auxiliary electrode 142 are connected to the driving power line PL through bridge 143.

The second buffer layer 122 are disposed on the first auxiliary electrode 141 and the second auxiliary electrode 142. The second buffer layer 122 has insulating property, and insulates the auxiliary electrode and the active layer 130 from each other.

The active layer A1 of the first thin film transistor TR1 and the active layer A2 of the second thin film transistor TR2 are disposed on the second buffer layer 122.

The active layers A1 and A2 include an oxide semiconductor material. According to another embodiment of the present disclosure, the active layers A1 and A2 are oxide semiconductor layers made of an oxide semiconductor material.

The gate insulating film 155 is disposed on the active layers A1 and A2. The gate insulating film 155 has insulating property, and spaces the active layers A1 and A2 apart from the gate electrodes G1 and G2. The patterned gate insulating film 155 is shown in FIG. 15. However, embodiment of the present disclosure is not limited to the example of FIG. 15, and the gate insulating film 155 may not be patterned.

The gate electrode G1 of the first thin film transistor TR1 and the gate electrode G2 of the second thin film transistor TR2 are disposed on the gate insulating film 155.

The gate electrode G1 of the first thin film transistor TR1 overlaps at least a portion of the active layer A1 of the first thin film transistor TR1. The gate electrode G2 of the second thin film transistor TR2 overlaps at least a portion of the active layer A2 of the second thin film transistor TR2.

The gate electrode G2 also overlaps at least a portion of the first auxiliary electrode 141 and the second auxiliary electrode 142.

Referring to FIGS. 14 and 15, a first capacitor electrode C11 of the first capacitor C1 is disposed on the same layer as the gate electrodes G1 and G2. The gate electrodes G1 and G2 and the first capacitor electrode C11 may be made by the same process using the same material.

The inter-layer dielectric film 170 is disposed on the gate electrodes G1 and G2 and the first capacitor electrode C11.

The source electrodes S1 and S2 and the drain electrodes D1 and D2 are disposed on the inter-layer dielectric film 170. According to one embodiment of the present disclosure, the source electrodes S1 and S2 are distinguished from the drain electrodes D1 and D2 for convenience of description but the source electrodes S1 and S2 and the drain electrodes D1 and D2 may be used interchangeably. Therefore, the source electrodes S1 and S2 may be the drain electrodes, and the drain electrodes D1 and D2 may be the source electrodes.

Also, the data line DL and the driving power line PL are disposed on the inter-layer dielectric film 170. The source electrode S1 of the first thin film transistor TR1 may be formed in a single body with the data line DL. The drain electrode D2 of the second thin film transistor TR2 may be formed in a single body with the driving power line PL.

According to one embodiment of the present disclosure, the source electrode S1 and the drain electrode D1 of the first thin film transistor TR1 are spaced apart from each other and thus connected with the active layer A1 of the first thin film transistor TR1. The source electrode S2 and the drain electrode D2 of the second thin film transistor TR2 are spaced apart from each other and thus connected with the active layer A2 of the second thin film transistor TR2.

In detail, the source electrode S1 of the first thin film transistor TR1 is in contact with a source region of the active layer A1 through a first contact hole H1.

The drain electrode D1 of the first thin film transistor TR1 is in contact with a drain region of the active layer A1 through a second contact hole H2, and is connected with the first capacitor electrode C11 of the first capacitor C1 through a third contact hole H3.

The source electrode S2 of the second thin film transistor TR2 is extended onto the inter-layer dielectric film 170 and thus partially serves as a second capacitor electrode C12 of the first capacitor C1. The first capacitor electrode C11 and the second capacitor electrode C12 overlap each other, whereby the first capacitor C1 is formed.

The source electrode S2 of the second thin film transistor TR2 is in contact with the source region of the active layer A2 through a fourth contact hole H4.

The drain electrode D2 of the second thin film transistor TR2 is in contact with the drain region of the active layer A2 through a fifth contact hole H5.

The first thin film transistor TR1 includes the active layer A1, the gate electrode G1, the source electrode S1, and the drain electrode D1, and serves as a switching transistor for controlling the data voltage Vdata applied to the pixel driving circuit PDC.

The second thin film transistor TR2 includes the active layer A2, the first and second auxiliary electrodes 141 and 142, the gate electrode G2, the source electrode S2, and the drain electrode D2, and serves as a driving transistor for controlling the driving voltage Vdd applied to the display element 710.

A passivation layer 175 is disposed on the source electrodes S1 and S2, the drain electrodes D1 and D2, the data line DL and the driving power line PL. The driving power line PL is connected to the first auxiliary electrode 141 and the second auxiliary electrode 142 through bridge 143. The passivation layer 175 planarizes upper portions of the first thin film transistor TR1 and the second thin film transistor TR2, and protects the first thin film transistor TR1 and the second thin film transistor TR2.

A first electrode 711 of the display element 710 is disposed on the passivation layer 175. The first electrode 711 of the display element 710 is connected with the source electrode S2 of the second thin film transistor TR2 through a sixth contact hole H6 formed in the passivation layer 175.

A bank layer 750 is disposed at an edge of the first electrodes 711. The bank layer 750 defines a light emission area of the display element 710.

An organic light emitting layer 712 is disposed on the first electrode 711, and a second electrode 713 is disposed on the organic light emitting layer 712. As a result, the display element 710 is completed. The display element 710 shown in FIG. 15 is an organic light emitting diode (OLED). Therefore, the display apparatus 100 according to one embodiment of the present disclosure is an organic light emitting display apparatus.

Figure 16:
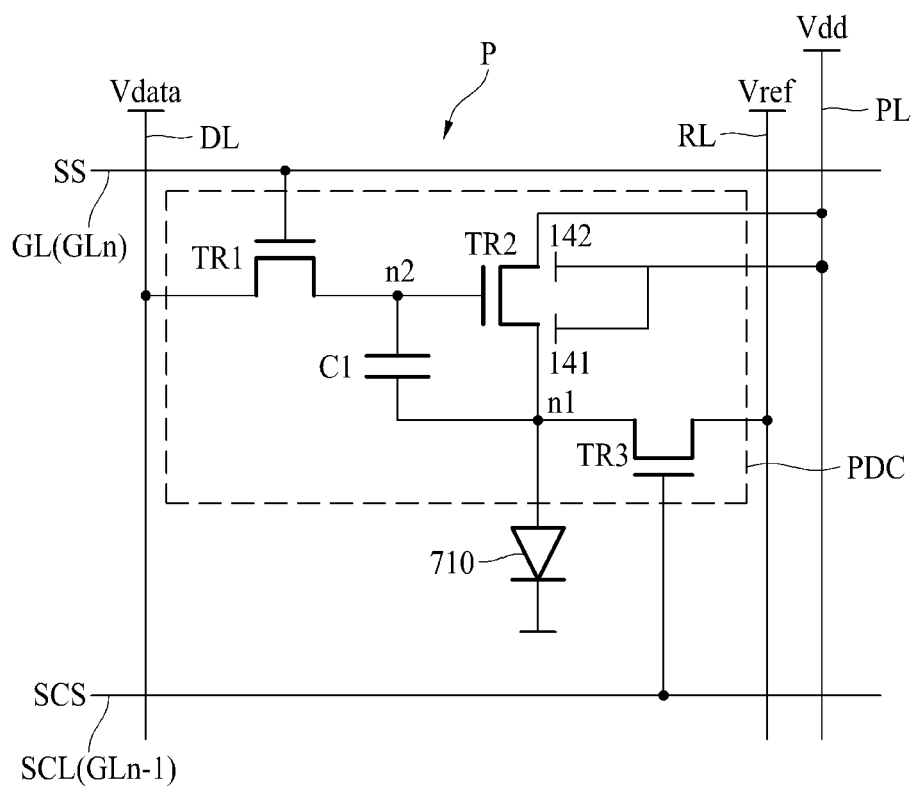
FIG. 16 is a circuit view illustrating a pixel of a display apparatus according to another embodiment of the present disclosure.

FIG. 16 is a circuit view illustrating a pixel P of a display apparatus 800 according to another embodiment of the present disclosure.

FIG. 16 is an equivalent circuit view illustrating a pixel P of an organic light emitting display apparatus.

The pixel P of the display apparatus 800 shown in FIG. 16 includes an organic light emitting diode (OLED) that is a display element 710, and a pixel driving circuit PDC for driving the display element 710. The display element 710 is connected with the pixel driving circuit PDC.

In the pixel P, signal lines DL, GL, PL, RL and SCL for supplying signals to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to a reference line RL, and a sensing control signal SCS is supplied to a sensing control line SCL.

Referring to FIG. 16, assuming that a gate line of an nth pixel P is "GLn", a gate line of a (n−1)th pixel P adjacent to the nth pixel P is "GLn−1", and the gate line "GLn−1" of the (n−1)th pixel P serves as a sensing control line SCL of the nth pixel P.

The pixel driving circuit PDC, for example, includes a first thin film transistor TR1 (switching transistor) connected with the gate line GL and the data line DL, a second thin film transistor TR2 (driving transistor) for controlling a size of a current output to the display element 710 in accordance with the data voltage Vdata transmitted through the first thin film transistor TR1, and a third thin film transistor TR3 (reference transistor) for sensing characteristics of the second thin film transistor TR2.

A first capacitor C1 is disposed between a gate electrode of the second thin film transistor TR2 and the display element 710. The first capacitor C1 is referred to as a storage capacitor Cst.

The first thin film transistor TR1 is turned on by a scan signal SS supplied to the gate line GL to transmit the data voltage Vdata, which is supplied to the data line DL, to a gate electrode of the second thin film transistor TR2.

The third thin film transistor TR3 is connected to a first node n1 between the second thin film transistor TR2 and the display element 710 and the reference line RL and thus turned on or off by the sensing control signal SCS, and senses characteristics of the second thin film transistor TR2, which is a driving transistor, for a sensing period.

A second node n2 connected with the gate electrode of the second thin film transistor TR2 is connected with the first thin film transistor TR1. The first capacitor C1 is formed between the second node n2 and the first node n1.

When the first thin film transistor TR1 is turned on, the data voltage Vdata supplied through the data line DL is supplied to the gate electrode of the second thin film transistor TR2. The data voltage Vdata is charged in the first capacitor C1 formed between the gate electrode and the source electrode of the second thin film transistor TR2.

If the second thin film transistor TR2 is turned on, the current is supplied to the display element 710 through the second thin film transistor TR2 in accordance with the driving voltage Vdd for driving the pixel, whereby light is output from the display element 710.

The display apparatus 800 according to another embodiment of the present disclosure may include at least one of the transistors 100, 200, 300, 400, 500 and 600 according to the embodiments of the present disclosure.

Figure 17:
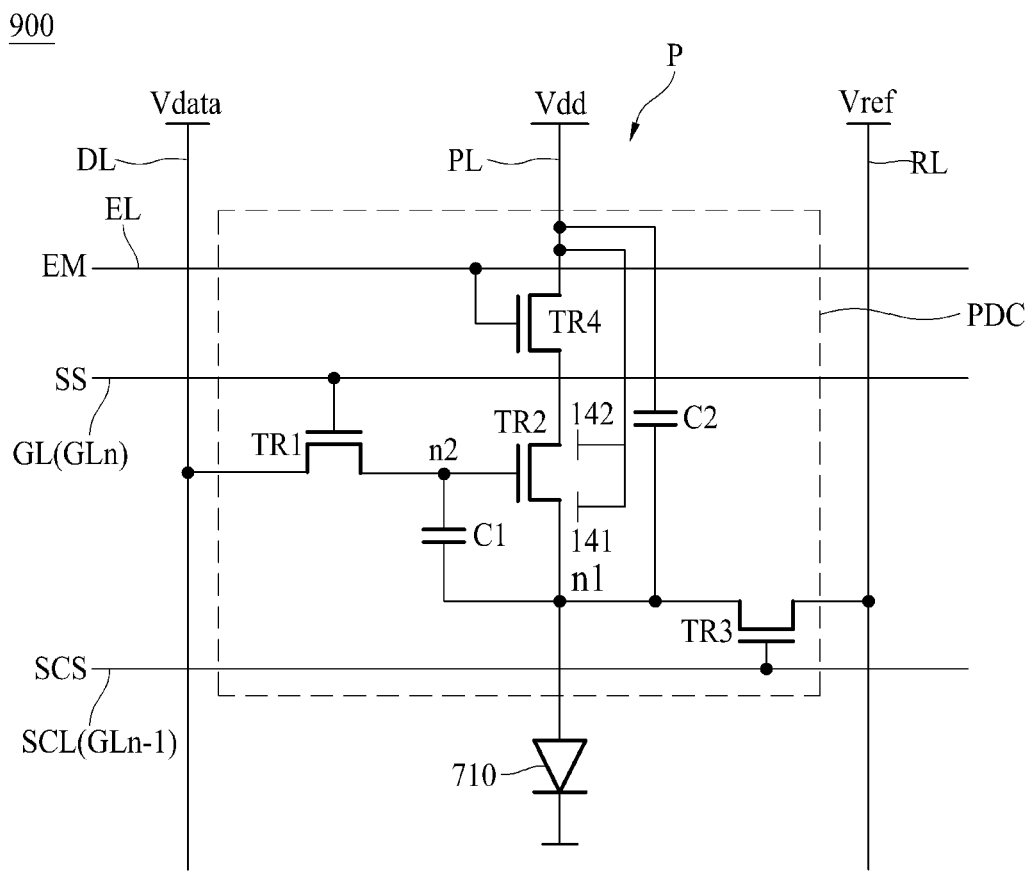
FIG. 17 is a circuit view illustrating a pixel of a display apparatus according to still another embodiment of the present disclosure.

FIG. 17 is a circuit view illustrating a pixel of a display apparatus 900 according to still another embodiment of the present disclosure.

The pixel P of the display apparatus 900 shown in FIG. 17 includes an organic light emitting diode (OLED) that is a display element 710, and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying signals to the pixel driving circuit PDC are disposed.

In comparison with the pixel P of FIG. 16, the pixel P of FIG. 17 further includes a light emission control line EL. An emission control signal EM is supplied to the light emission control line EL.

Also, the pixel driving circuit PDC of FIG. 17 further includes a fourth thin film transistor TR4 that is a light emission control transistor for controlling a light emission timing of the display element 710, in comparison with the pixel driving circuit PDC of FIG. 16.

Referring to FIG. 17, assuming that a gate line of an nth pixel P is "GLn", a gate line of a (n−1)th pixel P adjacent to the nth pixel P is "GLn−1", and the gate line "GLn−1" of the (n−1)th pixel P serves as a sensing control line SCL of the nth pixel P.

A first capacitor C1 is disposed between a gate electrode of the second thin film transistor TR2 and the display element 710. A second capacitor C2 is disposed between one of terminals of the fourth thin film transistor TR4, to which a driving voltage Vdd is supplied, and one electrode of the display element 710.

The first thin film transistor TR1 is turned on by a scan signal SS supplied to the gate line GL to transmit the data voltage Vdata, which is supplied to the data line DL, to a gate electrode of the second thin film transistor TR2.

The third thin film transistor TR3 is connected to the reference line RL and thus turned on or off by the sensing control signal SCS, and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM, or shields the driving voltage Vdd. When the fourth thin film transistor TR4 is turned on, a current is supplied to the second thin film transistor TR2, whereby light is output from the display element 710.

The display apparatus 900 according to still another embodiment of the present disclosure may include at least one of the transistors 100, 200, 300, 400, 500 and 600 according to the embodiments of the present disclosure.

The pixel driving circuit PDC according to still another embodiment of the present disclosure may be formed in various structures in addition to the above-described structure. The pixel driving circuit PDC may include five or more thin film transistors, for example.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A thin film transistor comprising:
   an auxiliary electrode;
   a gate electrode; and
   an active layer including oxide semiconductor material and disposed between the auxiliary electrode and the gate electrode,
   wherein the active layer includes:
   a channel portion including the oxide semiconductor material and overlapped with the gate electrode;
   a first connection portion including conductorized oxide semiconductor material and disposed at a first side of the channel portion; and
   a second connection portion including the conductorized oxide semiconductor material and disposed at a second side of the channel portion,
   wherein the channel portion includes a first portion overlapped with the auxiliary electrode and a second portion not overlapped with the auxiliary electrode, and
   wherein the auxiliary electrode overlaps the first portion of the channel portion, a boundary portion between the channel portion including the oxide semiconductor material and the first connection portion including the conductorized oxide semiconductor material, and first connection portion.

2. The thin film transistor of claim 1, wherein the auxiliary electrode overlaps an edge of the gate electrode.

3. The thin film transistor of claim 1, wherein the auxiliary electrode includes a portion that does not overlap the gate electrode and overlaps the active layer.

4. The thin film transistor of claim 1, wherein the auxiliary electrode is extended to an outside of an area that overlaps the gate electrode.

5. The thin film transistor of claim 1, wherein the gate electrode is disposed above the auxiliary electrode.

6. The thin film transistor of claim 1, further comprising a source electrode and a drain electrode respectively connected with the active layer,
   wherein a voltage applied to the auxiliary electrode is higher than a voltage applied to the source electrode.

7. The thin film transistor of claim 1, wherein the auxiliary electrode includes a first auxiliary electrode and a second auxiliary electrode spaced apart from each other in an area that overlaps the channel portion.

8. The thin film transistor of claim 7, wherein a same voltage is applied to the first auxiliary electrode and the second auxiliary electrode.

9. The thin film transistor of claim 7, wherein the first auxiliary electrode overlaps the channel portion, a boundary portion between the channel portion and the first connection portion, and the first connection portion.

10. The thin film transistor of claim 7, wherein the second auxiliary electrode overlaps the channel portion, a boundary portion between the channel portion and the second connection portion, and the second connection portion.

11. The thin film transistor of claim 7, wherein a spaced distance between the first auxiliary electrode and the second auxiliary electrode defines an effective channel length.

12. The thin film transistor of claim 1, wherein the second portion of the channel portion which is not overlapped with the auxiliary electrode serves as an effective channel.

13. The thin film transistor of claim 1, wherein an overlap distance between the auxiliary electrode and the channel portion is 1.5 µm or more.

14. The thin film transistor of claim 7, wherein each of an overlap distance between the first auxiliary electrode and the channel portion and an overlap distance between the second auxiliary electrode and the channel portion is 1.5 µm or more.

15. The thin film transistor of claim 7, wherein each of the first auxiliary electrode and the second auxiliary electrode has a width of 1.5 µm or more.

16. The thin film transistor of claim 11, wherein the spaced distance between the first auxiliary electrode and the second auxiliary electrode is 2 µm or more.

17. The thin film transistor of claim 1, wherein the active layer includes an oxide semiconductor material.

18. The thin film transistor of claim 1, wherein the active layer includes:
   a first oxide semiconductor layer; and
   a second oxide semiconductor layer on the first oxide semiconductor layer.

19. A display apparatus comprising a display element and the thin film transistor according to claim 1.

20. The display apparatus of claim 19, wherein the thin film transistor is a driving transistor for controlling a size of a current output to the display element.

* * * * *